United States Patent
Yang et al.

(10) Patent No.: US 7,282,435 B2
(45) Date of Patent: Oct. 16, 2007

(54) METHOD OF FORMING CONTACT FOR DUAL LINER PRODUCT

(75) Inventors: Haining S. Yang, Wappingers Falls, NY (US); Clement H. Wann, Carmel, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/492,456

(22) Filed: Jul. 25, 2006

(65) Prior Publication Data

US 2006/0261477 A1 Nov. 23, 2006

Related U.S. Application Data

(60) Division of application No. 10/904,059, filed on Oct. 21, 2004, now Pat. No. 7,098,536, which is a continuation-in-part of application No. 10/904,060, filed on Oct. 21, 2004, now Pat. No. 7,102,233.

(51) Int. Cl.
*H01L 21/4763* (2006.01)
*H01L 21/44* (2006.01)
*H01L 23/52* (2006.01)

(52) U.S. Cl. .......... 438/618; 438/655; 257/750
(58) Field of Classification Search ........... 257/744, 257/748, 750–754; 438/597, 618, 652–657
See application file for complete search history.

(56) References Cited

U.S. PATENT DOCUMENTS

| 6,211,035 | B1 | 4/2001 | Moise et al. | 438/396 |
| 6,599,813 | B2 | 7/2003 | Beyer et al. | 438/424 |
| 6,943,398 | B2 | 9/2005 | Ito et al. | 257/310 |
| 2003/0222299 | A1 | 12/2003 | Miura | 257/306 |

*Primary Examiner*—Calvin Lee
(74) *Attorney, Agent, or Firm*—Daryl K. Neff, Esq.; H. Daniel Schnurmann

(57) ABSTRACT

A method is provided of forming a contact to a semiconductor structure. A current-conducting member is formed which extends horizontally over a first portion of a semiconductor device region but not over a second portion of such semiconductor device region. A first film is formed which extends over the second portion and only partially over the member to expose a contact portion of the member. A first contact via is formed in conductive communication with the contact portion. The first contact via has a silicide-containing region self-aligned to an area of the member contacted by the contact via. A second contact via is formed in conductive communication with the second portion, the second contact via extending through the first film.

17 Claims, 5 Drawing Sheets

METHOD OF FORMING CONTACT FOR DUAL LINER PRODUCT

CROSS-REFERENCE TO RELATED APPLICATION

This application is a division of U.S. patent application Ser. No. 10/904,059 filed Oct. 21, 2004 and issued as U.S. Pat. No. 7,098,536, which is a continuation-in-part of U.S. patent application Ser. No. 10/904,060 filed Oct. 21, 2004 and issued as U.S. Pat. No. 7,102,233. The disclosures of which are incorporated herein by reference.

BACKGROUND OF THE INVENTION

The present invention relates to the structure and fabrication of semiconductor devices.

In fabricating integrated circuits in conventional bulk semiconductor wafers, wells of either p-type or n-type conductivity are implanted in a substrate of the opposite conductivity. However, in complementary metal oxide semiconductor (CMOS) technology, both p-type and n-type wells are utilized. Source/drain regions are formed by implanting diffusion regions of the opposite n-type or p-type conductivity as the wells to form metal-oxide-semiconductor field effect transistors (MOSFETs). Recent theoretical and empirical studies have also demonstrated that carrier mobility in a transistor can be increased when a stress of sufficient magnitude is applied to the conduction channel of a transistor to create a strain therein. An increase in the performance of an n-type field effect transistor (NFET) can be achieved by applying a tensile longitudinal stress to the conduction channel of the NFET. An increase in the performance of a p-type field effect transistor (PFET) can be achieved by applying a compressive longitudinal stress to the conduction channel of the PFET.

A stress-imparting film, also referred to herein as a "stressed" film, can be deposited to cover a semiconductor device region to impart a stress thereto for enhancing the conductivity of a transistor, for example, an NFET or a PFET device. Silicon nitride is one material, among others, which can be deposited in such way that the resulting material layer imparts either a tensile stress or a compressive stress to a layer of a second material with which it is in contact. To improve the conductivity of both an NFET and a PFET, a tensile stress-imparting nitride can be formed to cover an NFET device region and a compressive stress-imparting nitride can be formed to cover a PFET device region.

From a fabrication point of view, such a goal can be accomplished by applying two films, each having a different internal stress. In such case, one film 102 can be patterned, after which a second film 104 is deposited and then patterned to produce an overlapped boundary 100, as illustrated in the cross-sectional depiction of FIG. 1. An overlapped boundary, however, can create certain problems.

One such problem concerns the fabrication of a contact via 210 to a current-conducting member, e.g., a silicided polysilicon conductor 225, at a location overlying a shallow trench isolation (STI) region 110, i.e., at the boundary 220 between two differently stressed films. The etching of the contact hole at that boundary 220 can be very difficult to perform while etching other contact holes, such as the contact hole for contact via 212 to the polysilicon conductor 225. The difficulty arises because of the variation in thickness between the film 104 which overlies the silicided polyconductor 225 where the contact via 212 is formed, as compared to the combined thickness of the stressed film 104 together with the stressed film 102, which it overlaps at the boundary 220. As apparent from FIG. 1, the overlapped stressed films 102, 104 at the boundary 220 are much thicker than the film 104 where the contact via 212 is formed. Due to the variation in the total film thicknesses, there is increased likelihood that the etching of the contact hole for contact via 210 will fail to be etched to a sufficient depth to properly contact the silicided polysilicon conductor 225. Indeed, a contact open failure can result, as best seen at 220 in FIG. 2. A contact open failure is one in which much higher than normal contact resistance occurs at the interface between the conductive contact via and the polysilicon conductor. A contact open failure can occur when the contact hole fails to be etched sufficiently.

Consequently, a need exists for a structure and an associated method of fabricating a semiconductor device in which more than one stressed films can be provided, while permitting contact vias to be etched with less difficulty.

SUMMARY OF THE INVENTION

A method is provided of forming a contact to a semiconductor structure. A current-conducting member is formed which extends horizontally over a first portion of a semiconductor device region but not over a second portion of such semiconductor device region. A first film is formed which extends over the second portion and only partially over the member to expose a contact portion of the member. A first contact via is formed in conductive communication with the contact portion. The first contact via has a silicide-containing region self-aligned to an area of the member contacted by the contact via. A second contact via is formed in conductive communication with the second portion, the second contact via extending through the first film.

According to a preferred aspect of the invention, a transistor such as a p-type field effect transistor (PFET), is formed in the semiconductor device region, and the first film imparts a compressive stress to the conduction channel of the PFET. Also according to a preferred aspect of the invention, another transistor such as an n-type field effect transistor (NFET) is formed in another semiconductor device region, over which a tensile-stressed film is disposed, that film imparting a tensile stress to the conduction channel of the NFET.

DETAILED DESCRIPTION

Although an underlapped structure accomplishes the goals of providing dual stress imparted films over the NFET and the PFET and reduces the etching concerns in overlapped boundaries, but it does not resolve all of the etching concerns discussed earlier. One potential way of addressing the etching problem is to combine the benefits of reducing the thickness of the areas to be etched suggested with an etch-retarding process. Such solution will now be described with reference to FIGS. 3 through 10.

Figure 2:
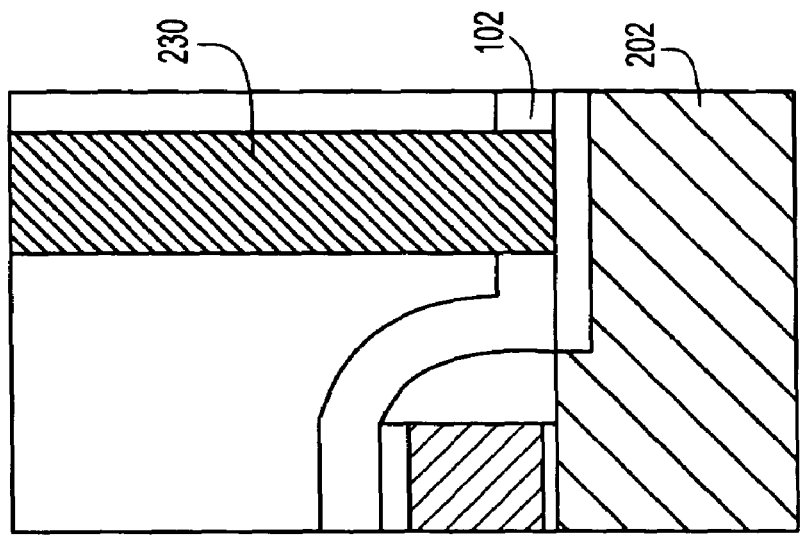
FIG. 2 is a cross-sectional view illustrating a different location of the semiconductor device structure shown in FIG. 1, at which a second conductive contact via is to be formed.
Figure 1:
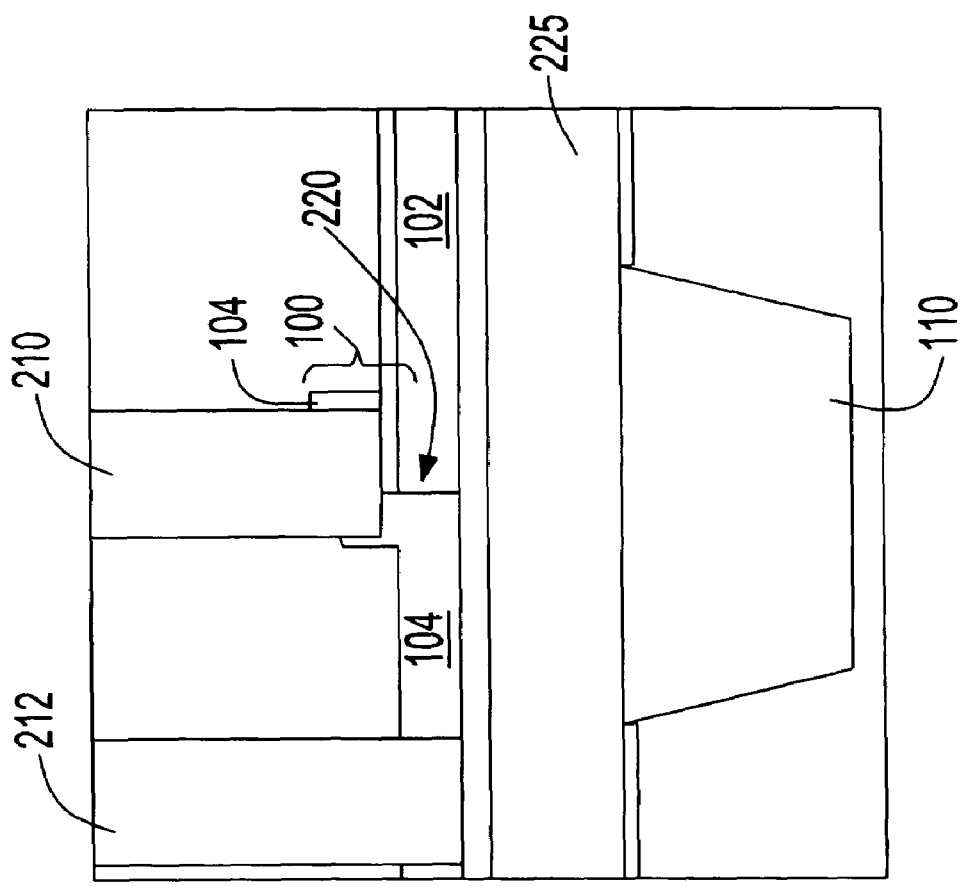
FIG. 1 is a cross-sectional view illustrating a semiconductor device structure over which two films, each having a different internal stress are applied and patterned to create an overlapped boundary, at which a first conductive contact via is to be formed.
Figure 3:
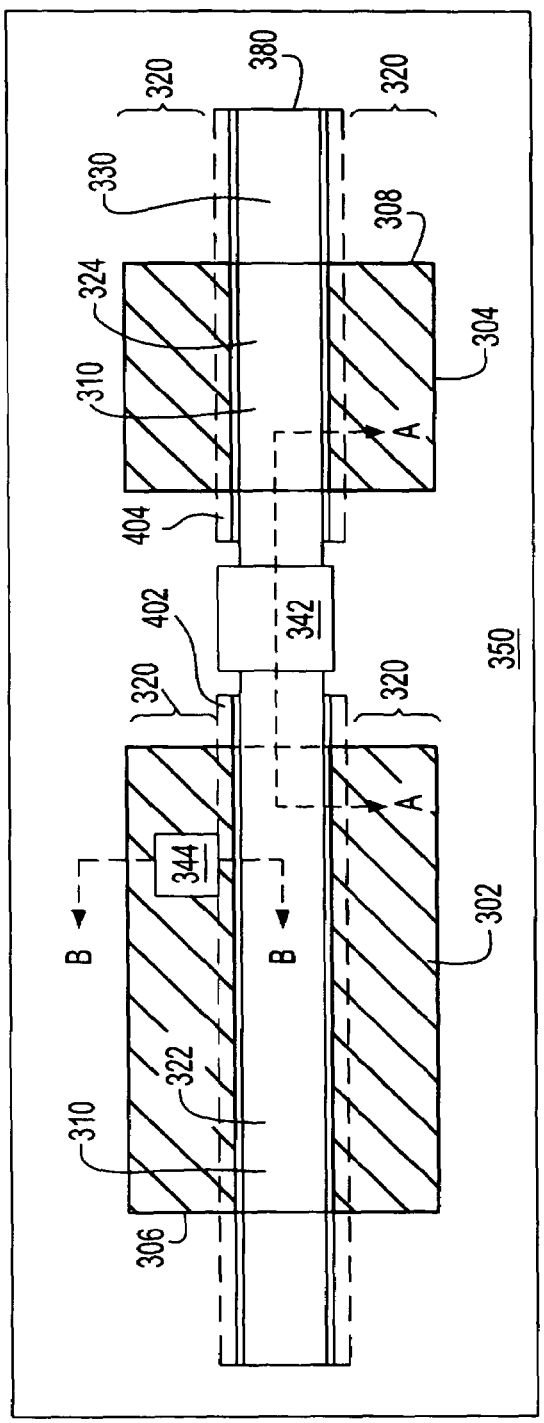
FIG. 3 is a top-down view illustrating a structure having underlapped stressed films and conductive contact vias, according to one embodiment of the present invention.

FIG. 3 is a top-down illustrating an embodiment of the present invention. As illustrated in FIG. 3, semiconductor device regions 302, 304 are provided in a semiconductor substrate. In the embodiment of FIG. 3, the semiconductor device regions 302, 304 are isolated by a shallow trench isolation 350, which surrounds them. The device regions 302, 304 are processed to form a p-type field effect transistor (PFET) in region 302 and an n-type field effect transistor (NFET) in region 304.

The semiconductor regions in which the NFET 304 and PFET 302 are fabricated can consist of a single-crystal semiconductor region of a substrate or wafer, the wafer being either a bulk substrate or a semiconductor-on-insulator substrate. For example, in a silicon-on-insulator (SOI) substrate, a relatively thin single-crystal region of a semiconductor is disposed as a device region over an insulating layer. When field effect transistors (FETs) are formed in such SOI substrates, faster switching operation is often achieved than otherwise, because junction capacitance between the channel region of the transistor and the bulk substrate is eliminated.

A conducting member 330, which includes portions functioning as the gate conductors 322 and 324 of the PFET and the NFET respectively, extends over first portions 310 utilized as channel regions of the semiconductor device regions 302, 304, the conducting member also extending over the STI region 350 between them. This conducting member provides a current conducting member extending from an outer end 306 of the PFET device region 302 to the outer end 308 of the NFET device region 304. The conducting member 330 also maintains the gate conductors 322, 324 at a common potential for both NFET and PFET. The current conducting member may be either comprised of a single layer or multiple layers. For example, in one embodiment of the present invention, the conducting member includes a polycrystalline semiconductor layer. In such case, the conducting member is referred to as "polyconductor" (PC). However, in an alternative embodiment, the current conducting member is comprised of a layer of silicide disposed over the polycrystalline semiconductor layer. The details of such multi-layer current conducting member cannot be illustrated adequately in FIG. 3, but are described below.

Polysilicon is a preferred material used in the fabrication of the conducting member 330 as a "polyconductor" to provide workfunction matching as the transistor gates for both the PFET and NFET. Second portions 320 of the device regions 302, 304, which are not traversed by the conducting member 330 are utilized as source/drain regions of the transistors, such regions being appropriately doped and processed for the respective transistor types. Dielectric spacers 380, e.g., silicon nitride or silicon oxide spacers, are disposed on sidewalls of the conducting member. Stressed films 402, 404, as will be described more fully below, overlie the device regions 302, 304, including the conducting member. The dashed lines indicate the locations where the stressed films rise vertically from the device regions along the dielectric sidewall spacers 380.

As also illustrated in FIG. 3, a contact via 342 is provided in conductive communication with the conducting member 330. A separate contact via to the source region of the PFET, for example, is illustrated at 344. While only one such contact via to the source of the PFET is illustrated in FIG. 3 for ease of reference, similar contacts are provided to both the source and drain regions of both the PFET and NFET. Such contact vias are made by forming contact holes at the respective locations and subsequently filling them to create the device contacts 342 and 344.

Figure 4:
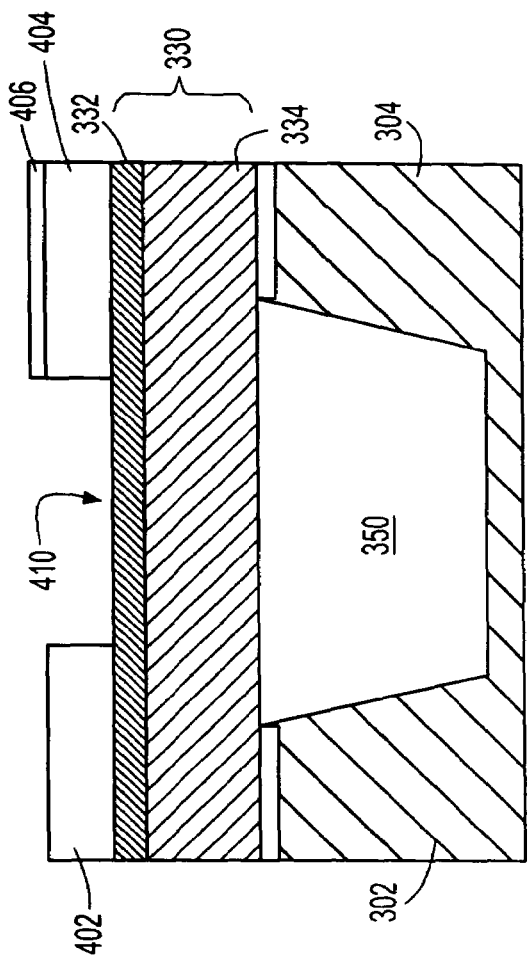
FIGS. 4-10 are cross-sectional views illustrating stages in fabrication of the structure shown in FIG. 3, according to embodiments of the invention.

FIG. 4 is a cross-sectional view, through line A-A, of the embodiment shown in FIG. 3. FIG. 4 illustrates more clearly a multi-layered current conducting member 330 that includes a first layer 334 including a material such as doped polysilicon and a second layer 332 including a silicide.

The stress-imparting films 402, 404 (also referred to herein as "stressed films") are patterned over the semiconductor device structure such that the two films do not meet in the middle, i.e., in such way that the two films can be the to be "underlapped." A first tensile-stressed film 404 extends over the NFET device region 304, as illustrated in FIG. 4. The film 404 is formed in such way to impart a tensile stress to the semiconductor material disposed in a channel region of the NFET in device region 304 below the conducting member 330. Such stressed film 404 enhances the performance of the NFET and the PFET over which it lies. A preferred example of such a film that can be used is a silicon nitride film ($Si_3N_4$). Another compressive-stressed film 402 is provided to impart a compressive stress to the PFET device region 302 over which it lies. An oxide layer 406 is disposed over the tensile stressed film 404 in the structure shown. This oxide layer is optionally omitted. A gap 410 is provided between the two films 402 and 404.

The stressed films 402, 404 are deposited and patterned by first blanket depositing a tensile-stressed film 404 over the entire structure including the PFET device region 302, the NFET device region 304, and the STI region 350, and then optionally depositing the layer of oxide 406 over the entire structure. The oxide layer and the tensile-stressed nitride layer 404 are then patterned together by photolithography and etching. In one embodiment, the oxide layer is omitted, as it is not specifically needed to form the structure shown in FIG. 4. Thereafter, a compressive-stressed film 402 is blanket deposited over the entire structure, and then patterning that film by photolithography and etching to form the structure shown.

Figure 5:
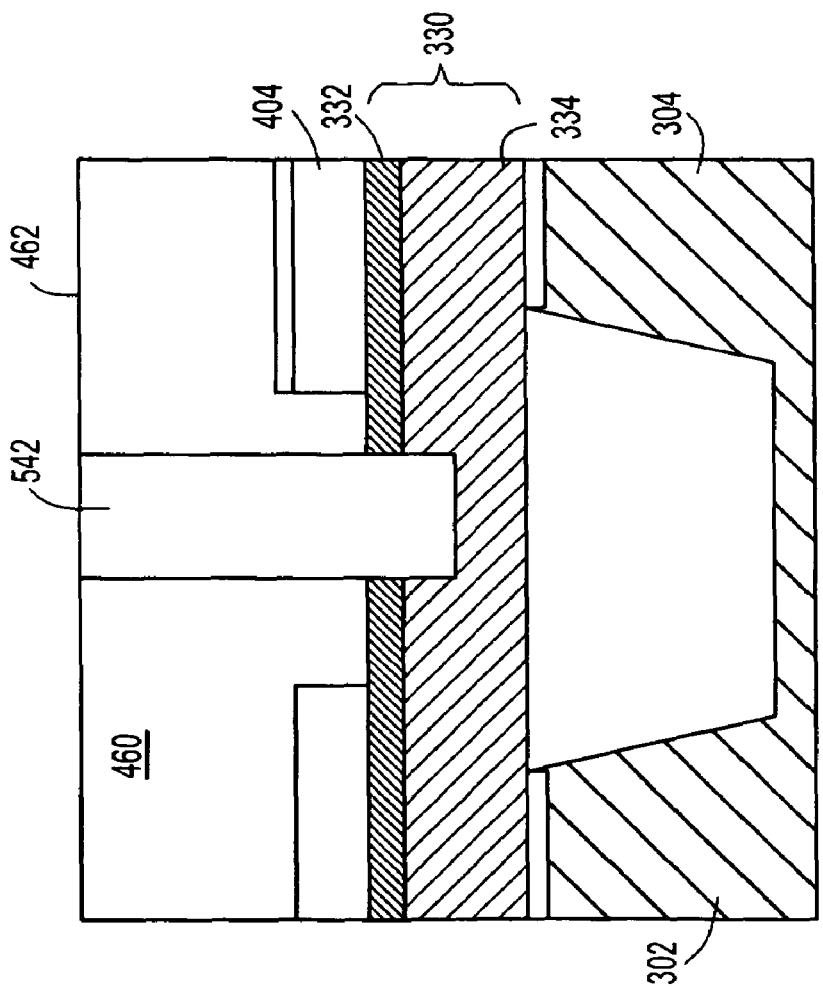

FIG. 5 illustrates a subsequent stage in fabrication of the structure, through the same view as shown in FIG. 4. As shown in FIG. 5, a dielectric region 460 is formed over the structure, such dielectric region including a material such as is commonly provided as an interlevel dielectric material. In one embodiment, the dielectric material is self-planarizing, such that an upper surface 462 of the dielectric region presents a substantially planar surface upon deposition. For example, a highly flowable oxide such as a doped silicate glass, e.g. borophosphosilicate glass (BPSG), borosilicate glass (BSG) or other silicate glass, e.g. undoped silicate glass (USG) serves such purpose. Alternatively, a spin-on-glass (SOG) material can be deposited and heat-treated to provide a relatively planar upper surface. An oxide deposited from a tetraethylorthosilicate (TEOS) precursor could also achieve relative planarity. Alternatively, or in addition thereto, specific processing can be performed after deposition to assist in planarizing the dielectric region 460, such as through chemical mechanical polishing (CMP).

In one embodiment, a barrier layer is provided in a manner as described in U.S. patent application Ser. No. 10/904,060 filed Oct. 21, 2004, which names Haining S. Yang as inventor. That application is hereby incorporated herein by reference. In such embodiment, a barrier layer covering substantially all of the area of the semiconductor device regions 302, 304, is disposed as an intermediate layer between a lower dielectric region and an upper dielectric region. The lower dielectric region is disposed vertically adjacent to the stressed films, the lower dielectric region having a substantially planar upper surface. The upper dielectric region is disposed over the barrier layer. The barrier layer is used to substantially prevent the diffusion of contaminants, e.g., metals such as copper, from the space above the upper dielectric region to structures below the barrier layer such as the semiconductor device regions 302, 304. The thickness of the interlevel dielectric layer 460 is illustratively between about 4000 and 5000 Å.

Figure 6:
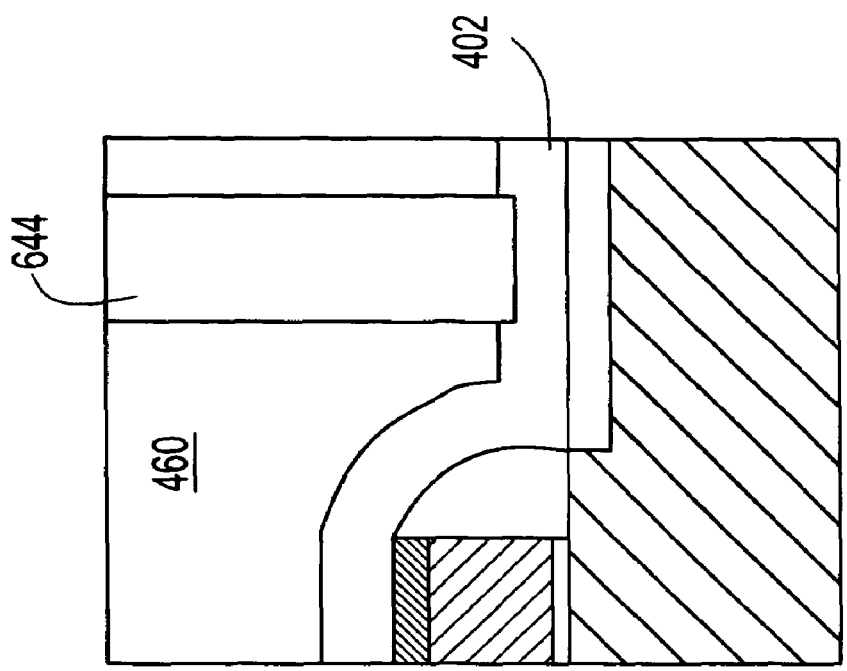

Thereafter, as shown in FIGS. 5 and 6, contact holes 542, 644 are simultaneously etched as an initial step in fabricating the contact vias 342, 344 described above relative to FIG. 3. In this initial stage of etching, the contact hole 542 is etched to its maximum etch depth. However, contact hole 644 is etched only part of the way towards its maximum etch depth. It is difficult, if not impossible, to provide an etching process which etches two substantially different materials at the same rate. Accordingly, the same etch steps that etch the contact hole 542 through the oxide dielectric region 460 and into the silicide region 332 and the polysilicon portion 334 of the polyconductor 330 result in the contact hole 644 only being etched through the dielectric region 460 to extend partially within the stressed nitride film 402.

Figure 7:
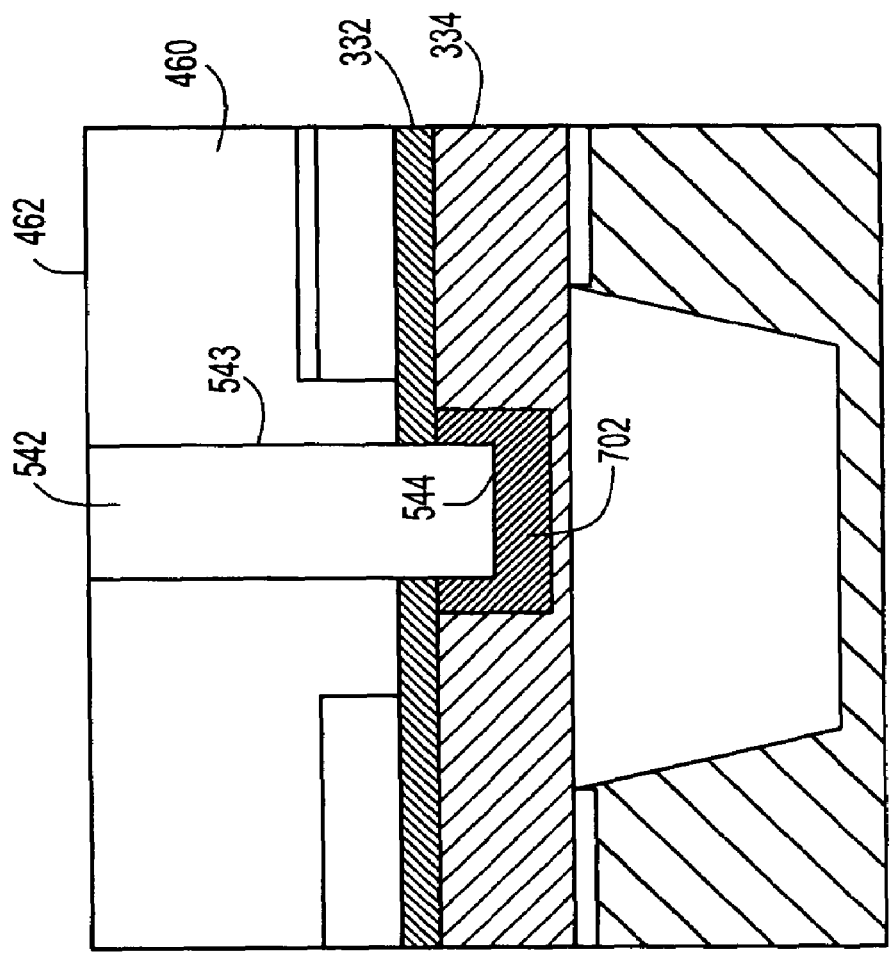

A second stage of forming the contact via is illustrated in FIG. 7. As shown therein, a self-aligned silicide-containing region 702 is formed at the interface 544 between the contact hole 542 and the polysilicon portion 334 of the conducting member 330. The silicide-containing region is formed by depositing a metal as a silicide precursor, such metal forming a layer along the bottom 544 and sidewall 543 of the contact hole. Preferably, the silicide precursor metal consists essentially of a metal such as titanium (Ti), cobalt (Co), nickel (Ni), tantalum (Ta), platinum (Pt), tungsten (W) or combination thereof, and region 702 includes the silicide of that metal. The silicide precursor metal can be the same metal or a different metal from that used to form the first silicide 332 which overlies the polysilicon portion 334 of the gate conductor. Thus, depending upon the silicide-precursor metal that is deposited, examples of a material of the silicide layer 702 include, but are not limited to: $TiSi_x$, $CoSi_x$, especially $CoSi_2$, $TiCoSi_x$, $NiSi$ and/or $NiSi_2$, $NiCoSi_x$, $TaSi_2$, $PtSi_2$, $NiPtSi_x$, and $WSi_x$, and mixtures thereof. The layer of metal lining the sidewall 543 of the contact hole 542 can either have uniform thickness, or instead be subject to variations in thickness from the bottom of the contact hole 544 to the upper surface 462 of the dielectric region 460. When depositing metal into an opening, variations in the thickness of deposited material are subject to occur based on proximity of the surface to the source of material to be deposited. Hence, parts of the contact hole 542 which are closer to the outer surface 462 of the dielectric region 460 are more likely to receive a thicker layer of metal during a deposition of the metal layer into the opening. On the other hand, parts of the contact hole 542 that are closer to the bottom 544 of the contact hole are more likely to receive a thinner layer of metal during the deposition. The embodiments of the invention described herein are suitable for use regardless of the variations in thickness of the deposited silicide-precursor metal at different locations of the contact hole 544.

The deposited metal is then reacted with the polysilicon layer 334 with which it is in contact, by annealing to form the silicide region 702. Portions of the deposited metal that do not contact the polysilicon layer 334 are thereafter selectively removed through a cleaning process that leaves the underlying structure substantially unaffected.

Figure 8:
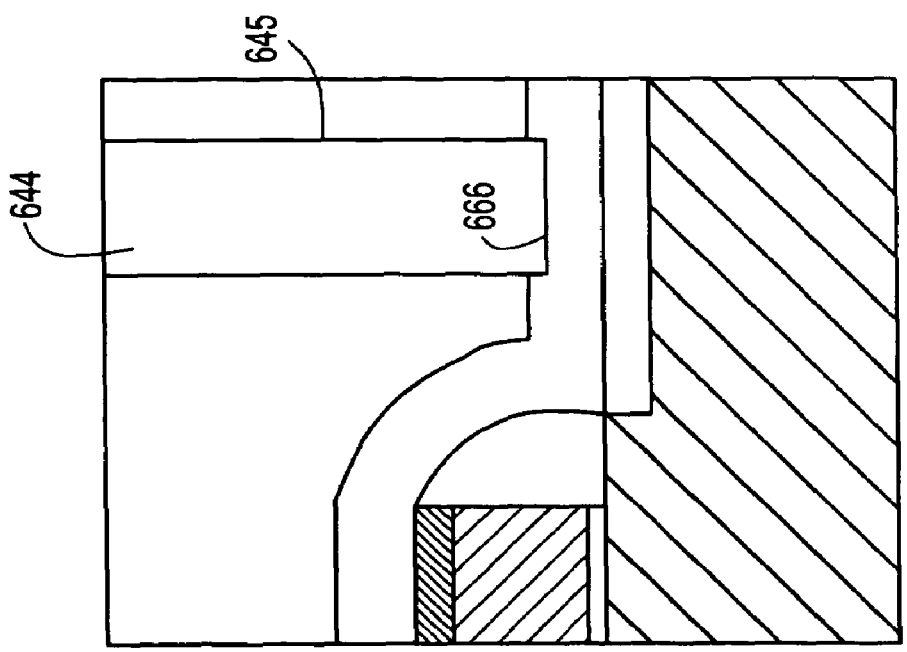

FIG. 8 a cross-sectional view illustrating the structure at contact hole 644, after the processing described above relative to FIG. 7 has been performed. Although, as described above, the silicide-precursor metal is deposited over the entire structure, including into contact hole 644, along the sidewall 645 of the hole and the bottom 666, since the deposited metal does not react with the underlying nitride of the stressed film 402, no silicide is formed. The unreacted metal is thus removed from the sidewall and bottom of the contact hole 644, such that it appears substantially as it did after being initially etched (FIG. 6). Note, however, that a step of removing the unreacted portion of the silicide precursor metal is optional, as the contact holes are subsequently filled with conductive fills.

Figure 10:
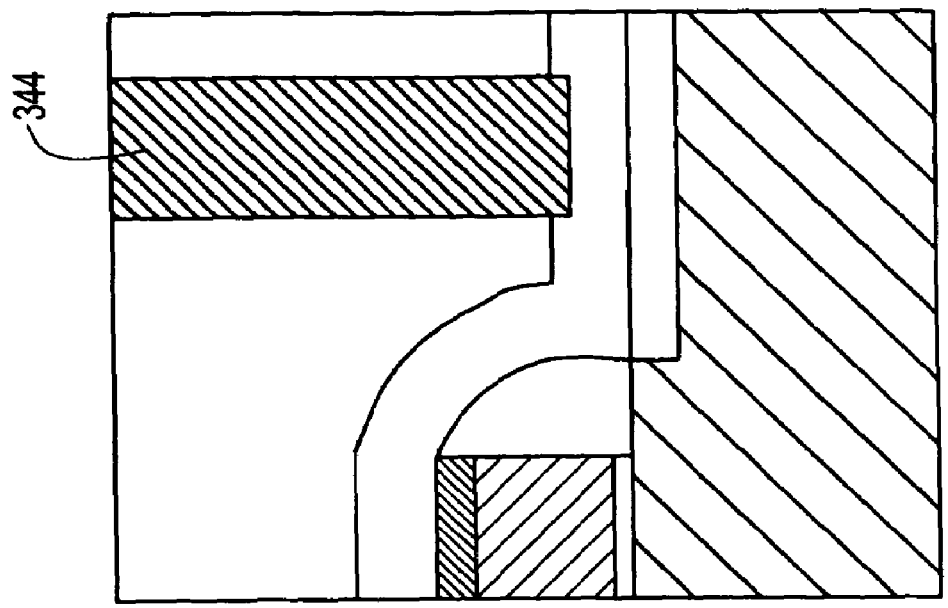
Figure 9:
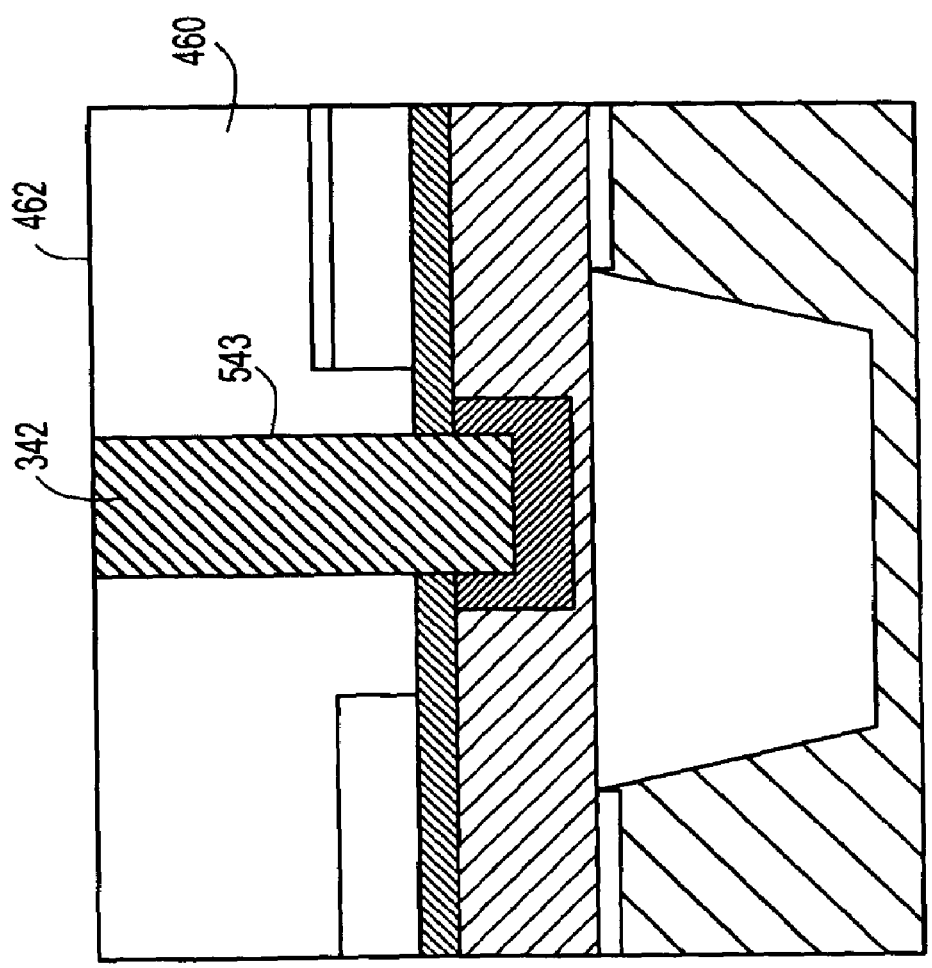

Thereafter, as shown in FIGS. 9 and 10, the contact holes are filled with conductive fills to form contact vias 342 and 344. Illustratively, the contact vias are filled by depositing a conductive barrier material such as a conductive nitride, e.g., titanium nitride (TiN) as a protective barrier, followed by the deposition of a metal, preferably tungsten, which can be deposited by a chemical vapor deposition (CVD) process. These depositions are then followed by processing to remove the excess deposited metal and conductive nitride materials from the upper surface 462 of the dielectric region, as by CMP, or an etch-back process, for example.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A method of forming a contact to a semiconductor structure, comprising:
   providing a semiconductor device region including a first portion and a second portion;
   forming a member extending horizontally over the first portion of the semiconductor device region but not over the second portion of the semiconductor device region, the member being adapted to conduct current;
   forming a first film extending over the second portion and only partially over the member to expose a contact portion of the member;
   forming a first contact via in conductive communication with the contact portion of the member, the first contact via having a silicide-containing region self-aligned to an area of the member contacted by the contact via; and
   forming a second contact via in conductive communication with the second portion, the second contact via extending through the first film.

2. The method as claimed in claim 1, wherein the first and second contact vias are formed simultaneously.

3. The method as claimed in claim 1, wherein the silicide-containing region is formed by forming a first contact hole contacting a silicon-containing region of the member, depositing a metal in the first contact hole, reacting the metal with the silicon-containing region to form a silicide and then removing an unreacted portion of the metal.

4. The method as claimed in claim 1, wherein the first film consists essentially of a nitride.

5. The method as claimed in claim 4, wherein the first film consists essentially of silicon nitride.

6. The method as claimed in claim 5, wherein the first member includes a polycrystalline semiconductor.

7. The method as claimed in claim 1, wherein the first film has an internal stress such that the first film imparts a stress to the first portion of the semiconductor device region.

8. The method as claimed in claim 1, further comprising forming a first transistor having a conduction channel disposed in the first portion and source and drain regions disposed in the second portion and having a gate conductor including at least a portion of the member, wherein the first film imparts a stress to the conduction channel.

9. The method as claimed in claim 8, wherein the semiconductor device region further includes a third portion and a fourth portion, the member extending over the third portion but not over the fourth portion, the method further comprising forming a second transistor having a conduction channel disposed in the third portion and source and drain regions disposed in the fourth portion, the second transistor having a gate conductor including at least a portion of the member, and forming a second film extending over at least the fourth portion and only partially over the member to expose the contact portion of the member, the second film imparting a stress to the second conductive channel.

10. The method as claimed in claim 9, wherein the first transistor is a field effect transistor having a p-type conduction channel ("PFET") and the second transistor is a field effect transistor having an n-type conduction channel ("NFET").

11. The method as claimed in claim 10, wherein the first film has a compressive internal stress such that the first film imparts a compressive stress to the conduction channel of the PFET.

12. The method as claimed in claim 11, wherein the second film has a tensile internal stress such that the second film imparts a tensile stress to the conduction channel of the NFET.

13. The method as claimed in claim 10, further comprising forming an etch-stop layer overlying at least one of the first and second films, and a dielectric region overlying and encapsulating the first and second transistors, wherein the first contact via extends through the dielectric region and contacts the member at a location below the etch-stop layer.

14. The method as claimed in claim 13, wherein the step of forming the first and second contact vias includes forming metallic liners lining the first and second contact vias, the metallic liners including a precursor metal of the silicide contained in the silicide-containing region of the first contact via.

15. The method as claimed in claim 1, further comprising forming a p-type field effect transistor (PFET) in the first and second portions of the semiconductor device region, the PFET having as a gate conductor the member, wherein the first film has a compressive internal stress such that the first film imparts a compressive stress to a channel region of the PFET.

16. The method as claimed in claim 15, wherein the semiconductor device region further includes a third portion and a fourth portion, the member extending over the third portion but not over the fourth portion, the method further comprising forming an n-type field effect transistor (NFET) in the third and fourth portions of the semiconductor device region, the NFET having a gate conductor including at least a portion of the member and forming a second film overlying the third and fourth portions of the semiconductor device region while exposing the contact portion of the member, the second film having a tensile internal stress such that the second film imparts a tensile stress to a channel region of the NFET.

17. A method of forming a contact to a semiconductor structure, comprising:

forming a p-type field effect transistor (PFET) and an n-type field effect transistor (NFET), the PFET and NFET having conduction channels disposed in respective first portions of a semiconductor device region, source and drain regions disposed in respective second portions of a semiconductor device region, and a current-conducting member extending horizontally over the first portions of the semiconductor device region but not over the second portions;

forming a first film having an internal compressive stress, the first film extending over the second portion of the device region of the PFET and only partially over the member such that the contact portion of the member is exposed;

forming a second film having an internal tensile stress, the second film extending over the second portion of the device region of the NFET and only partially over the member such that the contact portion of the member is exposed;

forming a first contact via in conductive communication with the contact portion of the member, the first contact via including a silicide-containing region self-aligned to an area of the member contacted by the contact via;

forming a second contact via in conductive communication with the second portion of the PFET, the second contact via extending through the first film; and forming a third contact via in conductive communication with the second portion of the NFET, the third contact via extending through the second film.

* * * * *